United States Patent
Horng et al.

(10) Patent No.: US 6,960,480 B1
(45) Date of Patent: Nov. 1, 2005

(54) METHOD OF FORMING A MAGNETIC TUNNELING JUNCTION (MTJ) MRAM DEVICE AND A TUNNELING MAGNETORESISTIVE (TMR) READ HEAD

(75) Inventors: Cheng T. Horng, San Jose, CA (US);
Liubo Hong, San Jose, CA (US);
Ru-Ying Tong, San Jose, CA (US);
Yu-Hsia Chen, San Jose, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 0 days.

(21) Appl. No.: 10/849,310

(22) Filed: May 19, 2004

(51) Int. Cl.$^7$ ............................................ H01L 21/00
(52) U.S. Cl. ........................... 438/3; 438/398; 438/488
(58) Field of Search ................................ 438/3, 48, 73, 438/395, 396, 397, 398, 399, 482, 488

(56) References Cited

U.S. PATENT DOCUMENTS

| | | | |
|---|---|---|---|
| 6,204,071 B1 * | 3/2001 | Ju et al. | 438/3 |
| 6,574,079 B2 | 6/2003 | Sun et al. | 360/324.2 |
| 6,614,630 B2 | 9/2003 | Horng et al. | 360/324.12 |
| 6,643,104 B2 | 11/2003 | Shimazawa | 360/319 |
| 6,653,704 B1 | 11/2003 | Gurney et al. | 257/421 |
| 6,657,826 B2 | 12/2003 | Shimazawa et al. | 360/322 |
| 6,703,654 B1 | 3/2004 | Horng et al. | 257/295 |
| 6,737,281 B1 * | 5/2004 | Dang et al. | 438/3 |

OTHER PUBLICATIONS

Y. Ando et al., "Growth Mechanisms of Thin Insulating Layer in Ferromagnetic Tunnel Junctions Prepared Using Various Oxidation Methods," J. Phys. D.: Appl. Phys., (2002) vol. 35, pp. 2415-2421.

"Exchange-Biased Magnetic Tunnel Junctions and Application to Nonvolatile Magnetic Random Access Memory (Invited)," by SS. P. Parkin et al., Jrnl. of Applied Physics, vol. 85, No. 8, Apr. 15, 1999, pp. 5828-5833.

"Progress and Outlook for MRAM Technology", by S. Tehrani et al., IEEE Trans. on Magnetics, vol. 35, No. 5, Sep. 1999, pp. 2814-2819.

"Junction Area Dependence of Breakdown Characteristics in Magnetic Tunnel Junctions," by Kwang-Seok Kim et al., Jrnl. of Appl. Phy., vol. 93, No. 10, May 15, 2003, pp. 8364-8366.

(Continued)

Primary Examiner—Phuc T. Dang
(74) Attorney, Agent, or Firm—George O. Saile; Stephen B. Ackerman

(57) ABSTRACT

An MTJ (magnetic tunneling junction) device particularly suitable for use as an MRAM (magnetic random access memory) or a tunneling magnetoresistive (TMR) read sensor, is formed on a seed layer which allows the tunneling barrier layer to be ultra-thin, smooth, and to have a high breakdown voltage. The seed layer is a layer of NiCr which is formed on a sputter-etched layer of Ta. The tunneling barrier layer for the MRAM is formed from a thin layer of Al which is radically oxidized (ROX), in-situ, to form the layer with characteristics described above. The tunneling barrier layer for the read sensor formed from a thin layer of Al or a HfAl bilayer which is naturally oxidized (NOX), in situ, to form the barrier layer. The resulting device has generally improved performance characteristics in terms of GMR ratio and junction resistance.

19 Claims, 2 Drawing Sheets

OTHER PUBLICATIONS

Co-Pending U.S. Patent HT-02-032, U.S. Appl. No. 10/768,917, filed Jan. 30, 2004, "A Novel Oxidation Method to Fabricate Low Resistance TMR Read Head", Assigned to the Same Assignee.

Co-Pending U.S. Patent HT-03-016, U.S. Appl. No. 10/820,391, filed Apr. 8, 2004, "A Novel Oxidation Structure/Method to Fabricate a High-Performance Magnetic Tunneling Junction MRAM," Assigned to the Same Assignee.

* cited by examiner

METHOD OF FORMING A MAGNETIC TUNNELING JUNCTION (MTJ) MRAM DEVICE AND A TUNNELING MAGNETORESISTIVE (TMR) READ HEAD

RELATED PATENT APPLICATION

This application is related to Ser. No. 10/371,841 filing date, Feb. 20, 2003, now issued as U.S. Pat. No. 6,703,645; Ser. No. 10/820,391, filing date Apr. 8, 2004 and Ser. No. 10/768,917, filing date Jan. 30, 2004, assigned to the same assignee as the current invention.

BACKGROUND OF THE INVENTION

1. Field of the Invention

This invention relates generally to magnetic tunneling junction (MTJ) devices such as MRAMs and read-heads and more particularly to the use of a novel seed layer that allows the formation of a junction layer of superior physical properties.

2. Description of the Related Art

The magnetic tunneling junction device (MTJ device) is essentially a variable resistor in which the relative orientation of magnetic fields in an upper and lower very thin dielectric layer (the tunneling barrier layer) formed between those electrodes. As electrons pass through the upper electrode they are spin polarized by its magnetization direction. The probability of an electron tunneling through the intervening tunneling barrier layer then depends on the magnetization direction of the lower electrode. Because the tunneling probability is spin dependent, the current depends upon the relative orientation of the magnetizations of magnetic layers above and below the barrier layer. Most advantageously, one of the two magnetic layers (the pinned layer) in the MTJ has its magnetization fixed in direction, while the other layer (the free layer) has its magnetization free to move in response to an external stimulus. If the magnetization of the free layer is allowed to move continuously, as when it is acted on by a continuously varying external magnetic field, the device acts as a variable resistor and it can be used as a read-head. If the magnetization of the free layer is restricted to only two orientations relative to the fixed layer (parallel and anti-parallel), the first of which produces a low resistance (high tunneling probability) and the second of which produces a high resistance (low tunneling probability), then the device behaves as a switch, and it can be used for data storage and retrieval (a MRAS).

Magnetic tunneling junction devices are now being utilized as information storage elements in magnetic random access memories (MRAMs). Typically, when used as an information storage or memory device, magnetic fields produced by orthogonally intersecting current carrying lines (digit and bit lines) orient the magnetization of the free layer so that it is either parallel or anti-parallel to the pinned layer; at a later time a sensing current passed through the MTJ indicates if it is in a high (antiparallel) or low (parallel) resistance state.

When used as a read head, (called a TMR read head, or "tunneling magnetoresistive" read head) the free layer magnetization is moved by the influence of the external magnetic fields of a recorded medium, such as is produced by a moving hard disk or tape. As the free layer magnetization varies in direction, a sense current passing between the upper and lower electrodes and tunneling through the barrier layer feels a varying resistance and a varying voltage appears across the electrodes. This voltage, in turn, is interpreted by external circuitry and converted into a representation of the information stored in the medium.

Whether it is used as an MRAM or as a TMR read head, fabrication of a high quality MTJ device presents considerable difficulties due to the necessity of forming layers of extreme thinness. Sun et al. (U.S. Pat. No. 6,574,079) provides a particularly well written statement of some of these difficulties. First, to obtain effective spin polarization of the conduction electrons, the magnetization of the electrode layers must be strong. This is itself a problem, since the layers are exceptionally thin. Second, the resistance of the tunneling barrier layer is typically high, which results in a poor ratio of signal-to-noise (S/N) in read head applications. If the resistance of the barrier layer is lowered by excessively thinning that layer, then fabrication processes such as lapping the air-bearing surface of the read head can create shorts through the barrier layer. Sun et al. teach the formation of a thin barrier layer within a general configuration of the following form:

Ta/NiFe/CoFe/Barrier/CoFe/Ru/CoFe/PtMn/Ta with Ta/Cu/Ta used as top and bottom leads. In the configuration of Sun et al. shown above, Ta is a seed layer, NiFe/CoFe is a free layer, CoFe/Ru/CoFe is a pinned (fixed) layer, PtMn is a pinning layer and Ta is a protective capping layer. Sun et al. find that a preferred barrier layer within the given configuration is a layer of oxidized NiCr, ie NiCrOx. The barrier layer so formed yields a junction resistance, RA, (area of junction, A, times total resistance, R) of about: RA=6.6 $\Omega\mu m^2$.

Applicants have discovered other recent prior art (commercially produced) TMR read head configurations analogous to that taught by Sun et al., including:

Ta/NiFe/MnPt/CoFe(10%)/Ru/CoFe(50%)/Al/NOX/
    CoFe—NiFe(18%)/Ta

Ta/NiFe/IrMn/CoFe(16%)/Al/(4.5)Hf(1.5)/NOX/
    CoFe—NiFe(18%)/Ta

In the above notation Al/NOX refers to an aluminum layer that has been naturally oxidized to form an insulating barrier layer. Al (4.5)Hf(1.5)/NOX refers to a 4.5 angstrom aluminum layer over which is deposited 1.5 angstroms of Hafnium, with the composite layer then being naturally oxidized. CoFe(16%) refers to a CoFe alloy with 16% Fe by number of atoms. In each of the above configurations NiFe is a buffer layer for growing the antiferromagnetic layer of MnPt or IrMn.

Applicants have found that a tunneling junction with improved performance over those of the prior art, particularly those cited above, can be made using a novel seed layer and method of forming it. The tunneling junction so formed, which can also be used in either a TMR configuration or an MRAM configuration, is capable of producing a junction resistance of RA≅1 $\Omega\mu m^2$ and a GMR ratio, DR/R>10% and a dielectric breakdown voltage, $V_b$>0.5 volts.

SUMMARY OF THE INVENTION

A first object of this invention is to provide a method of forming a smooth, ultra thin tunneling barrier layer suitable for incorporation in a TMR read head or an MTJ MRAM.

A second object of this invention is to provide such a tunneling barrier layer with low junction resistance, high GMR ratio and high breakdown voltage which can be used in a read head suitable for reading recordings of high density (>100 Gb/in$^2$).

A third object of this invention is to provide a method of forming an MTJ MRAM element with a very smooth and flat bottom electrode (pinned layer), on which can be formed a tunnel barrier layer having the properties listed above.

A fourth object of the present invention is to provide an MTJ MRAM element having well controlled free layer magnetization, well controlled magnetization of the pinned layer as evidenced by a large exchange field and thermal stability and a tunneling barrier layer with physical integrity.

The objects of the present invention will be achieved in both an TMR read head or an MTJ MRAM configuration by a method that improves the topography (reduces roughness) of the bottom electrode in the MRAM or the pinned layer of the TMR read head and allows the formation of an ultra-thin tunneling barrier layer that meets the requirements set forth above.

An MRAM bottom electrode configuration normally has the form:

Ta/NiFe/MnPt (or IrMn)/CoFe (or CoFe/Ru/CoFe).

Here, Ta plays the role of a capping layer for the conducting lead (which is not indicated but which could be NiCr/Ru), NiFe plays the role of a buffer or seed layer (to promote superior structure of subsequently deposited layers), MnPt is an antiferromagnetic (AFM) pinning layer (sometimes abbreviated MP) and CoFe alone or a CoFe/Ru/CoFe laminate is a pinned layer. It is well known in the art that the roughness of the bottom electrode (the MnPt/CoFe portion) is greatly affected by the seed layer on which it is grown (NiFe above). We have found that, depending on the conducting lead material, the Ta capping layer will grow in either its α-phase (body-centered cubic), or its β-phase (tetragonal). It is also known that an NiFe layer deposited on the Ta layer grows with a strong (111) crystal orientation in the plane of the layer. Thus, when the MnPt (or IrMn) antiferromagnetic material is deposited onto the (111) oriented NiFe layer, a highly desirable large exchange pinning field is obtained. However, the remaining objects of a high GMR ratio low junction resistance and high breakdown strength of the barrier layer are not obtained.

To meet the all the objects of this invention, it was decided to use NiCr as a buffer (seed) layer rather than the conventional NiFe and to form it on the Ta layer after a sputter-etch process of the Ta layer. The Ta layer is itself formed on a NiCr/Ru conducting lead layer. It has already been demonstrated in commonly assigned Application HT 02-019, which is fully incorporated herein by reference, that a Ru lead layer formed on a NiCr seed layer is advantageous for the further deposition of smooth layers, so the formation of a sputtered Ta layer on the Ru layer produces a smooth surface also on the Ta. The Ta is then sputter-etched and a second NiCr seed layer is formed upon it. It is the formation of this second NiCr seed layer on the sputter-etched Ta underlayer that allows the objects of this invention to be achieved as follows.

Two differently configured sensor stack configurations for a TMR sensor are used in this invention:

(A): Ta60/SE Ta30/NiCr40/AFM/SyAP/Al 5.75/NOX/CoFe (10%)-NiFe(18%)/Ta (B): Ta60/SE Ta30/NiCr40/AFM/SyAP/Al 4.5-Hf 1.5/NOX/CoFe(10%)-NiFe(18%)/Ta

In both (A) and (B), the particular notation: Ta60/SE Ta30, indicates that a 60 angstrom layer of Ta has been deposited as a capping layer on an underlying conduction lead layer (which is not indicated) and then between 20 and 30 angstroms of that 60 angstrom layer of Ta is removed by sputter-etching (SE) it. The NiCr buffer (seed) layer is then deposited on the sputter-etched Ta underlayer. The sputter etched surface of the Ta promotes a smooth flat overlayer, which in this case is the NiCr buffer (seed) layer.

An antiferromagnetic pinning layer, symbolized AFM, is deposited on the NiCr. The AFM can be MnPt 150 angstroms thick (or IrMn 90 angstroms thick). A synthetic antiferromagnetic pinned layer (SyAP) is formed on the AFM, in this case the SyAP is CoFe(10%)/Ru7.5/CoFe (50%), or CoFe(10%)/Ru7.5/CoFe(25%), where the numbers in percents (%) refer to atom percentages of Fe in the CoFe alloy. A layer of aluminum (Al), 5.75 angstroms thick is then deposited on the SyAP and is oxidized by a process of in-situ natural oxidation (NOX) to form a tunnel barrier layer. It is to be noted that oxidation of such a thin Al layer is most advantageously done by NOX, whereas oxidation of thicker layer, such as 7–12 angstroms of Al, is more advantageously done by radical oxidation (ROX), which is fully explained in related Application HT 03-016 which is fully incorporated herein by reference. As will be further discussed, the 5.75 angstrom Al layer is a double atomic layer of Al. This NOX process is taught in commonly assigned Application HT 02-032, fully incorporated herein by reference. Note that the difference between configurations (A) and (B) is that in (B) the NOX barrier layer is a bilayer of Al 4.5-Hf 1.5. A free layer of CoFe(10%)-NiFe(18%) is then formed over the naturally oxidized aluminum (or aluminum-hafnium) and a second Ta capping layer is formed over the free layer.

The importance of the sputter-etched Ta layer on which is grown the NiCr seed layer in achieving the objects of this invention (high GMR ratio, low junction resistance, high breakdown voltage) is shown by the results of experiments we performed. In these experiments we compared prior art methods of forming magnetic tunnel junction (MTJ) MRAM devices with the method of the present invention. The prior art methods had already been shown to provide very high quality performance, but the method of the present invention provided improvements in all areas. In this experiment we formed four different bottom electrodes for an MRAM device and formed identical ROX aluminum barrier layers of initial 10 angstrom thickness. The four configurations are shown in the following table and are compared in terms of their GMR ratio (DR/R), junction resistance, RA, and breakdown voltage, $V_b$.

| # | Bottom Electrode Structure | DR/R(%) | RA($\Omega\mu m^2$) | $V_b$(V) |
|---|---|---|---|---|
| 1 | Ta/SE/NiCr40/MP150/CoFe40/Al 10-ROX | 36 | 3755 | 1.65 |
| 2 | Ta/SE/NiFe50/MP150/CoFe40/Al 10-ROX | 22 | 1200 | 1.30 |
| 3 | Ta/SE/NiFe40/MnIr90/CoFe40/Al 10-ROX | 21 | 1900 | 1.40 |
| 4 | Ta/NiCr40/MP150/CoFe40/Al 10-ROX | 8–15 | 400–1000 | <1.10 |

Structures #1,2 and 3 are all formed on a sputter-etched (SE) Ta layer and are superior in all parameters over structure #4 in which the Ta layer is not sputter-etched. Structures #2 and 3 include the sputter-etched Ta layer but use the prior art NiFe seed layer. Structures #2 and 3 differ only in the material of the AFM pinning layer, ie. MnPt vs. IrMn. The measured differences between #2 and #3 are small. Structure #1 is the present invention, and embodies the sputter-etched Ta on which is formed the NiCr seed layer. Structure #1 is superior in all respects to structures #2, #3 and #4. In particular, the high junction resistance indicates a proper degree of Al oxidation, whereas the lower junction resistance of structures #2, #3 and 4 indicate under-oxidation has occurred. As is disclosed in HT 03-016, the ROX treatment of all structures is carried out in a plasma oxidation chamber furnished with a grid between the electrode that ionizes the oxygen and the surface being oxidized. The ionized oxygen, in passing through the grid, creates a shower of oxygen radicals, including atomic, molecular and ionized oxygen, which impinge on the surface with less energy than in plasma oxidation, where the oxygen is not reduced in energy by the grid. In addition to the measured values noted in the table above, high-resolution TEM images strongly support the effectiveness of the present invention and show a very smooth and conformal oxidized Al layer when the method of the present invention is used.

MRAM Configuration

The bottom electrode, #1 in the table, would be incorporated in the following MRAM element that would achieve the objects of the present invention:
NiCr/Ru400/Ta/SE/NiCr40/MP150/CoFe40 µl 10/ROX/ CoFe20/NiFe40/Ru250.

In the above configuration NiCr/Ru400/Ta is a smooth bottom conducting lead. Sputter-etching the Ta and forming the NiCr40 on it produces the seed layer of the present invention. The NiCr/MP (MnPt) 150/CoFe is the smooth bottom electrode (the pinned layer). The in-situ ROX 10 angstrom thick aluminum layer is the tunneling barrier layer. The CoFe20/NiFe40/Ru250 is the upper (free) electrode with its upper conducting lead layer.

TMR read sensor configuration

The bottom electrode, #1, above would serve as a pinned layer for the formation of a TMR read sensor of either of the following configurations:
(A): Ta80/SE Ta30/NiCr40/AFM/SyAP/Al 5.75/NOX/CoFe (10%)-NiFe(18%)/Ta
(B): Ta80/SE Ta30/NiCr40/AFM/SyAP/Al 4.50-Hf 1.5/ NOX/CoFe(10%)-NiFe(18%)/Ta For read sensor operation the junction resistance should be as low as possible. The minimum barrier thickness, as estimated from a theoretical calculation, suggests that a layer of $Al_2O_3$ formed by the in-situ natural oxidation of two atomic layers of Al would already have a relatively wide band-gap, indicating good insulating properties. Two such layers, formed in the (111) atomic plane, have a thickness of approximately 5.75 angstroms. This is the layer indicated in (A) above. The layer in (B) substitutes a naturally oxidized Al-Hf layer for the Al layer.

DESCRIPTION OF THE PREFERRED EMBODIMENTS

First Embodiment: MRAM Device

The present invention, in a first preferred embodiment, is a method of forming an MTJ MRAM by the use of a novel NiCr seed layer formed on a sputter-etched Ta layer so that the subsequently formed tunneling junction layer is ultra-thin and smooth and has a high breakdown voltage. In a second preferred embodiment the present invention is a method of forming a TMR read head having a high GMR ratio, low junction resistance and high tunneling layer breakdown voltage, using the novel NiCr seed layer formed on a sputter-etched Ta layer.

Figure 1A:
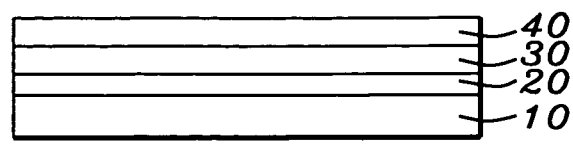
FIGS. 1a–1d are schematic cross-sectional views of the formation of an MTJ MRAM device using the method of the present invention.

Referring now to FIG. 1a, there is seen in a schematic cross section an initial stage of a preferred embodiment of the invention, the formation of a single MRAM element, which can be a part of an array of such elements. It is to be understood that in the embodiments to be disclosed in what follows, all layer depositions take place in an ultra-high vacuum system suitable for depositing thin layers by sputtering. In these embodiments the system was a commercially available Anelva 7100 system which includes an ultra-high vacuum a sputtering chamber as well as a plasma oxidation chamber, but other comparable systems are also suitable. In the Anelva system, sputtering depositions and sputter etch process take place in the same system, which is a simplifying aspect of the fabrication process. However, this is not a necessary element of the present invention. It is also noted that in all the embodiments to be discussed, when the tunneling barrier layer was to be oxidized, the fabrication already formed (having the un-oxidized layer on it) was removed from the sputtering chamber of the ultra-high vacuum system and placed in a separate oxidation chamber for the oxidation process to occur. This movement of the fabrication from one chamber to another within the system is done without a break in the vacuum. Again, it is possible that other systems and chamber configurations may be different and yet not affect the practice of the invention. Subsequent to the oxidation, the fabrication is replaced into the sputtering chamber of the ultra-high vacuum sputtering system, again without a break in the vacuum, for the remaining layer depositions.

There is shown first a substrate (10), which in this embodiment is a silicon substrate on which will be formed the MRAM element. It is understood that the single MRAM element to be described can be one of an array of such elements and that such element or array may be further connected to associated circuitry used in changing, storing and retrieving information. On the substrate is deposited a first seed layer (20), which in this embodiment is a layer of NiCr(35%–45%) formed to a thickness between approximately 50 and 100 angstroms, with approximately 50 angstroms being preferred. On the first seed layer is then formed a layer of non-magnetic metal (30), which in this embodiment is a smooth layer of Ru, formed to a thickness between approximately 250 and 1000 angstroms, with approximately 400 angstroms being preferred. On the Ru layer there is then formed a capping overlayer (40), which in this embodiment is a layer of Ta formed to a thickness between approximately 60 and 80 angstroms, with approximately 60 angstroms being preferred.

Figure 1B:
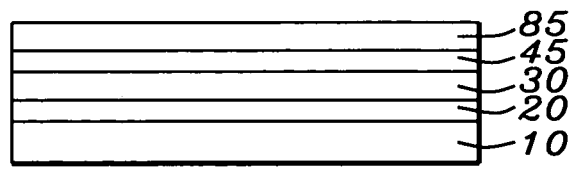

Referring now to FIG. 1b, there is shown the Ta overlayer (40) of FIG. 1a after being sputter-etched to remove between approximately 20 and 30 angstroms of its original thickness, with 30 angstroms of removal being preferred. This thinned, sputter-etched layer, now denoted (45), has an amorphous surface that will provide the necessary smooth overgrowth of subsequently deposited layers to form the barrier layer that meets the objects of the invention. On this sputter-etched layer of Ta, there is then formed a second seed/buffer layer (85) of NiCr(35%–45%) to a thickness between approximately 30 and 50 angstroms, with 40 angstroms being preferred.

Figure 1C:
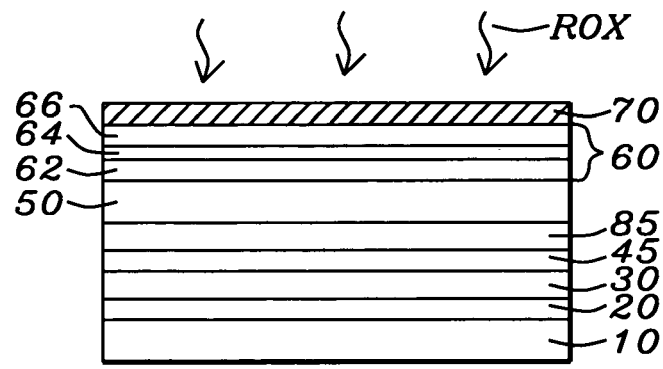

Referring next to FIG. 1c, there is seen the formation of an antiferromagnetic pinning layer (50), which in this embodiment is a layer of MnPt formed to a thickness between approximately 100 and 200 angstroms, with approximately 150 angstroms being preferred. On the pinning layer there is then formed a pinned layer (60), which in this embodiment is a laminated synthetic antiferromagnetic (SyAF) structure further comprising first (62) and second (66) layers of CoFe between which is formed a coupling layer of Ru (64). The first CoFe layer (62) is a layer of CoFe(10%) formed to a thickness between approximately 15 and 25 angstroms with 20 angstroms being preferred. The second CoFe layer (66) is a layer of CoFe(25%) or CoFe (50%) formed to a thickness between approximately 10 and 20 angstroms with 15 angstroms being preferred. The Ru layer, formed to provide a strong antiparallel coupling of the CoFe layer magnetizations, is formed to a thickness between approximately 7 and 8 angstroms with 7.5 angstroms being preferred. On this pinned layer there is formed a tunneling barrier layer (70) by first depositing an Al layer between approximately 7 and 12 angstroms with approximately 10 angstroms being preferred. The fabrication thus far formed is then removed from the sputtering chamber of the ultra-high vacuum system and placed in a plasma oxidation chamber where it is oxidized by a shower of oxygen radicals in a ROX oxidation process (shown as curved arrows). Briefly, the ROX process as applied to achieve the objects of the present invention is a plasma oxidation process carried out within a plasma oxidation chamber wherein a grid-like cap is placed between an upper ionizing electrode and the wafer surface being oxidized. Oxygen gas is then fed to the upper electrode and power is supplied to the electrode to at least partially ionize the gas. Passage of the partially ionized gas through the cap produces a shower of oxygen atoms, molecules, radicals and ions and renders the various species produced by the electrode less energetic when they arrive at the wafer surface. Within the plasma chamber used herein, an upper electrode within the chamber is fed with 0.5 liters of oxygen gas to produce a shower of oxygen radicals. Power is supplied to the electrode at a rate of 500 to 800 watts.

This ROX tunneling barrier layer is formed to exceptional smoothness and uniformity and has a high breakdown voltage, all being a result of its formation over the sputter-etched Ta overlayer (40) and NiCr layer (85).

Figure 1D:
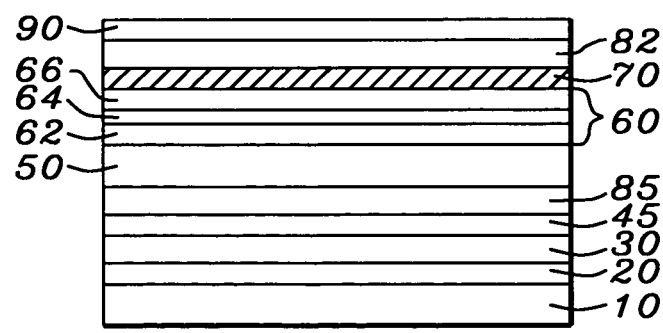

Referring next to FIG. 1d, there is seen the formation of a free layer on the barrier layer. The free layer is preferably a layer of CoFe (82) formed to a thickness between approximately 5 and 15 angstroms with approximately 10 angstroms being preferred, on which is formed a layer of NiFe (84) of thickness between approximately 20 and 50 angstroms with approximately 30 angstroms being preferred. A capping and conducting upper lead layer is formed on the NiFe layer as a layer of Ru (90) between approximately 100 and 300 angstroms, with 250 angstroms being preferred.

Second Embodiment: TMR Sensor

Figure 2A:
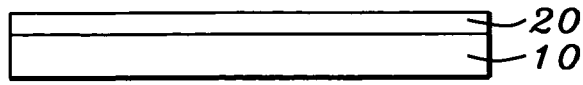
FIGS. 2a–2d are schematic cross-sectional views of the formation of an TMR read head using the method of the present invention.

Referring now to FIG. 2a, there is seen a schematic cross-sectional view of the initial steps of a second embodiment of the present invention, which is the formation of a TMR read sensor. As in the MRAM formation described above, the TMR read sensor is also formed as a series of layers in the sputtering chamber of an ultra-high vacuum sputtering system. It is to be noted, although it is known to those skilled in the art, that the tunneling magnetic junction configuration, when used to form an MRAM element as in the first embodiment, is formed between a word line and a bit line, insulated from the former and contacting the latter, whereas the tunneling magnetic junction configuration, when used to form a magnetoresistive read sensor, ie a TMR sensor, is formed between upper and lower magnetic shields, contacting them both since they serve as conducting leads.

Figure 2B:
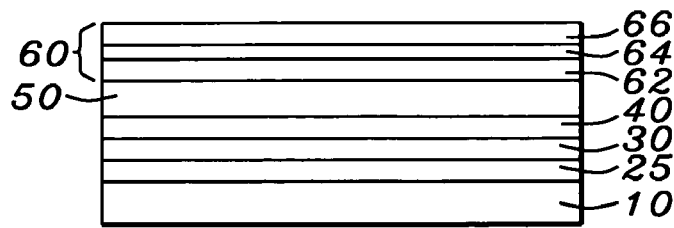

Referring again to FIG. 2a, there is first seen a substrate (10), which in this embodiment could be a lower shield/lead layer formed of NiFe and capped with a layer of Ta (20) which is formed to a thickness between 50 and 80 angstroms, with approximately 60 angstroms being preferred. Referring next to FIG. 2b, there is shown thinned Ta layer, now denoted (25), subsequent to being sputter-etched, to remove between approximately 20 and 30 angstroms of its original thickness, with 30 angstroms of removal being preferred. This sputter-etch process, which renders the Ta surface smooth and amorphous, is in preparation for the deposition of the NiCr seed layer (40) which, when formed on the Ta surface is the novel aspect of this invention. The NiCr seed layer is formed to a thickness between approximately 40 and 60 angstroms with approximately 50 angstroms being preferred.

Still referring to FIG. 2b, there is shown the formation of an antiferromagnetic pinning layer (50), which is preferably a layer of MnPt formed to a thickness between approximately 100 and 200 angstroms, with 150 angstroms being preferred, but which can also be a layer of IrMn formed to a thickness between approximately 50 and 100 angstroms with approximately 90 angstroms being preferred. On this pinning layer there is then formed a pinned layer (60) which in this embodiment is a laminated synthetic structure providing a strong pinning field, comprising first (62) and second (66) layers of CoFe, between which is formed a layer of Ru (64). The first CoFe layer is CoFe(10%) and is between approximately 15 and 20 angstroms in thickness with approximately 19 angstroms being preferred, the second CoFe layer is CoFe(50%) between approximately 18 and 25 angstroms in thickness with approximately 20 angstroms being preferred and the Ru layer is between approximately 7 and 8 angstroms, with approximately 7.5 angstroms being preferred.

Figure 2C:
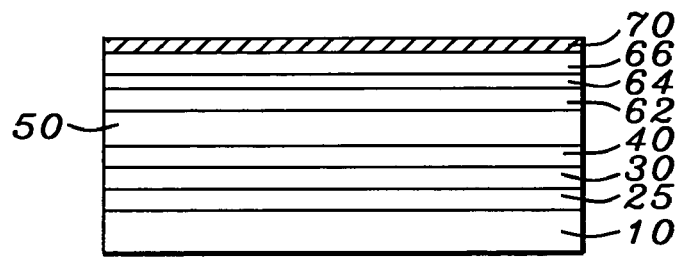

Referring next to FIG. 2c, there is shown the formation of a tunneling barrier layer (70), which is formed to exceptional smoothness and uniformity and has a high breakdown voltage, all being a result of its formation over the sputter-etched tantalum and NiCr layers. The barrier layer is a dielectric layer which in one form of this embodiment is a layer of in-situ, naturally oxidized aluminum, $AlO_x$ of final thickness between approximately 9 and 10 angstroms with approximately 9 angstroms being preferred. The oxidized Al layer is formed by oxidizing a sputtered Al layer in a separate oxidation chamber where it is naturally oxidized (NOX) in-situ. The NOX process, which is advantageously applied to thinly formed layers, requires purging the oxidation chamber with oxygen gas at a pressure of approximately 75 millitorr and leaving the as-deposited layer in contact with the oxygen gas for approximately 15 minutes. The deposited Al layer is initially approximately 5.75 angstroms thick and is a double atomic layer formed in the (111) crystalline plane. Such an oxidized layer, even though only two atomic layers thick, already has a sufficiently wide band-gap to be an effective insulating layer and tunneling barrier layer. This tunneling barrier layer is formed to exceptional smoothness and uniformity and has a high breakdown voltage, all being a result of its formation over the sputter-etched tantalum and NiCr layers. In another version of the embodiment, the barrier layer is formed by first depositing a double layer, which is a layer of Hf of thickness between approximately 1 and 2 angstroms with approximately 1.5 angstroms being preferred, over which is deposited a layer of Al of thickness between approximately 4 and 5 angstroms with approximately 4.5 angstroms being preferred. This double layer is then subjected to a process of in-situ natural oxidation in a manner similar to that of the Al layer alone to produce a layer of $HfAlO_x$. Once the oxidation process is complete, the fabrication is returned to the sputtering chamber of the high vacuum system for subsequent layer depositions.

Figure 2D:
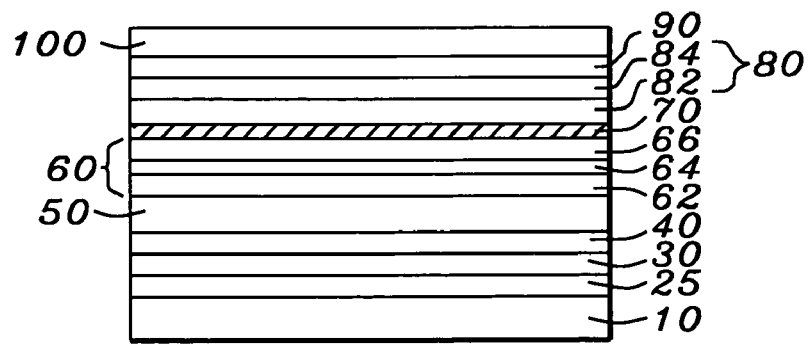

Referring now to FIG. 2d, there is shown the fabrication of FIG. 2c, now returned to the sputtering chamber. On the barrier layer (70), there is then formed a ferromagnetic free layer (80), which in this embodiment is a laminated layer comprising a layer (82) of CoFe (10%) of thickness between approximately 5 and 15 angstroms with approximately 10 angstroms being preferred, on which is formed a layer (84) of NiFe (18%) of thickness between approximately 20 and 50 angstroms with approximately 40 angstroms being preferred. On the free layer is then formed an upper capping layer (90), which in this embodiment can be a layer of Ta formed to a thickness between approximately 200 and 300 angstroms, with approximately 250 angstroms being preferred. An NiFe upper shield and conducting lead layer (100) is then formed on the capping layer.

As is understood by a person skilled in the art, the preferred embodiments of the present invention are illustrative of the present invention rather than limiting of the present invention. Revisions and modifications may be made to methods, materials, structures and dimensions employed in forming and providing an MTJ device in either a TMR read head configuration or in an MRAM configuration, said devices having a smooth, uniform and ultra-thin tunneling barrier layer of high breakdown voltage, while still forming and providing such a device and its method of formation in accord with the spirit and scope of the present invention as defined by the appended claims.

What is claimed is:

1. A method of forming a magnetic tunneling junction (MTJ) MRAM device with an ultra-thin tunneling barrier layer of high smoothness and breakdown voltage comprising:
   providing a substrate having a substantially planar upper surface;
   forming a first NiCr seed layer on said substrate;
   forming a non-magnetic metal layer on said seed layer;
   forming a Ta overlayer on said metal layer and sputter-etching said overlayer;
   forming a second NiCr seed layer on said sputter-etched Ta overlayer;
   forming an AFM pinning layer on said seed layer;
   forming a pinned layer on said pinning layer;
   forming a layer of Al on said pinned layer; and
   oxidizing said Al layer in a plasma oxidation chamber, by a process of radical oxidation, to form a tunneling barrier layer on said pinned layer, said tunneling barrier layer being ultra-thin, smooth and having a high breakdown voltage as a result of the NiCr seed layer formed on the sputter-etched Ta overlayer; and
   forming a free layer on said tunneling barrier layer;
   forming an upper capping layer on said free layer.

2. The method of claim 1 wherein all layer formations are by sputtering in an ultra-high vacuum sputtering chamber.

3. The method of claim 1 wherein said first and second NiCr seed layers are formed of NiCr having 35%–45% Cr by number of atoms.

4. The method of claim 1 wherein the metal layer is a layer of Ru formed to a thickness between approximately 250 and 1000 angstroms.

5. The method of claim 1 wherein the overlayer of Ta is formed to a thickness between approximately 60 and 80 angstroms and is then sputter-etched to remove between approximately 20 and 30 angstroms of said Ta and to render the sputter- etched surface smooth and amorphous.

6. The method of claim 1 wherein the formation of the synthetic pinned layer comprises:
   forming a first ferromagnetic layer, which is a layer of CoFe(10%), to a thickness between approximately 15 and 25 angstroms;
   forming a coupling layer of Ru, to a thickness between approximately 7 and 8 angstroms on said first layer;
   forming a second ferromagnetic layer, which is a layer of CoFe(25%) or CoFe(50%), to a thickness between approximately 10 and 20 angstroms;
   magnetically coupling the two CoFe layers with antiparallel magnetizations.

7. The method of claim 1 wherein the Al layer is formed to a thickness between approximately 7 and 12 angstroms.

8. The method of claim 1 wherein the process of radical oxidation of said Al layer further comprises:
   placing the Al layer into a plasma oxidation chamber that includes an upper electrode, a lower electrode and a grid positioned between said electrodes;
   placing said Al layer in contact with the lower electrode;
   feeding the upper electrode within the chamber with 0.5 liters of oxygen gas while providing power to the upper electrode at a rate of between 500 and 800 watts to produce a shower of oxygen radicals through said grid which impinge on said Al layer.

9. The method of claim 1 wherein the ferromagnetic free layer is formed as a double layer comprising a layer of CoFe formed to a thickness between approximately 5 and 15 angstroms on which is formed a layer of NiFe of a thickness between approximately 20 and 50 angstroms.

10. The method of claim 1 wherein the upper capping layer is formed as a layer of Ru to a thickness of between approximately 200 and 300 angstroms.

11. A method of forming a tunneling magnetoresistive (TMR) read head with an ultra-thin tunneling barrier layer of high smoothness and breakdown voltage comprising:
   providing a substrate, which is an NiFe lower shield and conducting lead layer having a substantially planar upper surface;
   forming a Ta overlayer on said substrate;
   sputter-etching said Ta overlayer, reducing it in thickness and rendering its upper surface smooth and amorphous;
   forming an NiCr seed layer on said sputter-etched Ta overlayer;
   forming an AFM pinning layer on said seed layer;
   forming a synthetic pinned layer on said pinning layer;
   forming a naturally oxidized tunneling barrier layer on said pinned layer, said tunneling barrier layer being smooth and homogeneous as a result of being formed on said Ta sputter-etched overlayer and said NiCr seed layer;
   forming a free layer on said tunneling barrier layer;
   forming an upper capping layer on said free layer; and
   forming an NiFe upper shield and conducting lead layer on said capping layer.

12. The method of claim 11 wherein all layer formations are by sputtering in an ultra-high vacuum sputtering chamber.

13. The method of claim 11 wherein said NiCr seed layer is formed of NiCr having 35%–45% Cr by number of atoms.

14. The method of claim 11 wherein the overlayer of Ta is formed to a thickness between approximately 60 and 80 angstroms and is sputter-etched to remove between approximately 20 and 30 angstroms and to render the sputter-etched surface smooth and amorphous.

15. The method of claim 11 wherein the antiferromagnetic pinning layer is a layer of MnPt formed to a thickness of between approximately 100 and 200 angstroms.

16. The method of claim 11 wherein the formation of the synthetic pinned layer comprises:
   forming a first ferromagnetic layer of CoFe(10%) formed to a thickness between approximately 20 and 25 angstroms;
   forming a coupling layer of Ru on said first ferromagnetic layer, to a thickness between approximately 7 and 8 angstroms
   forming a second ferromagnetic layer of CoFe(50%) on said Ru layer, to a thickness between approximately 25 and 30 angstroms.

17. The method of claim 11 wherein the process of forming a naturally oxidized tunneling barrier layer comprises:
   forming a layer of Al or a bilayer of HfAl on said pinned layer;
   placing said formation into an oxidation chamber;
   purging said chamber with oxygen gas at approximately 75 millitorr pressure;
   leaving the fabrication in the chamber for approximately 15 minutes.

18. The method of claim 17 wherein said Al layer is formed to a thickness of approximately 5.75 angstroms, as a double atomic layer in the (111) crystal plane and, when oxidized, forms a layer having the wide band-gap of an insulating material.

19. The method of claim 17 wherein the Hf layer of said HfAl bilayer is formed to a thickness of between approximately 1 and 2 angstroms and the Al layer is formed to a thickness of between approximately 4 and 5 angstroms.

* * * * *